United States Patent [19]
Pattenden

[11] Patent Number: 5,406,075
[45] Date of Patent: Apr. 11, 1995

[54] EXTERNALLY-MOUNTED UTILITY METER READING ARRANGEMENT

[75] Inventor: Stephen C. Pattenden, St. Albans, England

[73] Assignee: GPT Limited, United Kingdom

[21] Appl. No.: 39,379

[22] PCT Filed: Aug. 21, 1992

[86] PCT No.: PCT/GB92/01544
§ 371 Date: Apr. 20, 1993
§ 102(e) Date: Apr. 20, 1993

[87] PCT Pub. No.: WO93/04445
PCT Pub. Date: Mar. 4, 1993

[30] Foreign Application Priority Data
Aug. 21, 1991 [GB] United Kingdom ............... 9118072
Apr. 3, 1992 [GB] United Kingdom ............... 9207350

[51] Int. Cl.⁶ .............................................. H01J 5/16
[52] U.S. Cl. ......................... 250/227.21; 250/231.13
[58] Field of Search ............... 250/227.21, 231.11, 250/231.13, 231.14, 231.15, 231.16, 231.17, 237 G

[56] References Cited
U.S. PATENT DOCUMENTS
4,213,119  7/1980  Ward et al. ........................ 340/151

FOREIGN PATENT DOCUMENTS
251549    8/1988  Germany .
2034882   6/1980  United Kingdom .
2185812   7/1987  United Kingdom .
2192708   1/1988  United Kingdom .

Primary Examiner—David C. Nelms
Attorney, Agent, or Firm—Kirschstein, et al.

[57] ABSTRACT

A meter reading arrangement has an optical fiber transmission path made up of a pair of optical fibers connecting between a meter to be read and a meter interface unit. Light is transmitted over one of the fibers to an indicator on the meter and reflected light is transmitted by the second fiber to a transducer in the interface unit.

15 Claims, 4 Drawing Sheets

EXTERNALLY-MOUNTED UTILITY METER READING ARRANGEMENT

BACKGROUND OF THE INVENTION

1. Field of the Invention

This invention relates to a remote meter reading arrangement and particularly to such an arrangement that uses an optical fibre local transmission system.

2. Description of Related Art

The concept of remote meter reading has been considered for a number of years. However, most of the plans and designs to date have concerned individual utilities, involved new and incompatible designs for meters, have failed to take account of the installed base of mechanical meters and have failed to take the concept to its ultimate and logical conclusion, which is for an integrated meter reading scheme where all utilities share the same transmission system and a central billing authority which collates the data and presents its accounts for payment to users at a greater frequency than the utilities have done to date individually.

The Technology may conveniently be split into three sections.

METER READING
DATA COUNTING
AND TRANSMISSION.

It is an inconvenient fact that Domestic meters for Gas, Electricity and Water each in their own way occupy inhospitable environments for electronic devices.

Electricity meters suffer from power surges and electrical interference.

Gas meters should, ideally, be kept separate from electrical devices because of the risk of leakage and explosion.

Water meters are usually found in damp conditions and frequently become submerged.

While the technology exists to keep electronics working in the most evil of environments, it is usually at a cost. It is important for each section of the automated meter reader to be cheap and trouble free.

The simplest method of reading any existing mechanical meter is to exploit the dials which rotate as the utilities product is consumed. If a light is focussed on a section of the fastest rotating dial and a light sensitive transducer is similarly focussed on the same point, as the dial rotates, the light level returned to the transducer will vary.

The counters may not necessarily be rotating discs but may take any other convenient form such as a flap display or electronically designed L.E.D.

SUMMARY OF THE INVENTION

It is an object of the present invention to improve and clarify the previous proposals for remote optical meter reading and is particularly concerned with the means for transmitting the light and for processing it when received in reflected form.

According to the present invention a meter reading arrangement comprises means for directing light at a meter having at least one moving indicator, wherein light is directed at the fastest moving indicator on the meter and an optical fibre transmission path links the meter to a remotely located meter interface unit, one end of the said fibre optical transmission path being directed at the said fastest moving indicator and the other onto transducer means at the interface unit, whereby each variation in light level reflected from the meter is transmitted to the interface unit for processing.

There may also be provided a second fibre optical transmission path over which light is directed from a remote source onto the meter for reflection to the interface unit. Focusing means may be provided adjacent the meter for focusing transmitted and/or reflected light.

The interface unit conveniently includes optical transducer means for sensing sequential variation changes in the amplitude of reflected transmitted light.

The meter interface unit may connect optically to a plurality of meters remotely situated from the interface unit and from each other, each meter being monitored over a separate optical path, and may integrate all the information provided by the variation counts for further onward transmission to another location where it can be interpreted for accounting, managerial and monitoring purposes.

The onward transmission means may be any suitable form which may include further optical fibre transmission cables, coaxial cables (such as used by cable TV), telephone lines, radio or mains carrier transmission over power cables.

Modulated light may be used to enhance the signal from the reflected light, to remove interference by ambient light and for the detection of fraud and rupture of the fibre optic cable or removal of the reading head. The modulated light may be mono-chromatic.

The light which is transmitted from the meter interface unit to the meter is reflected by varying amounts dependent upon the marking on the surface of the indicating means on the meter or when it is intercepted by a pointer which may rotate on the face or dial of the meter. Preferably the indicator means is a rotary means such as a ferraris disk which may have markings on its edge or face which will variably reflect the light from the optical fibre cable which may be directed to the edge or surface or both, a test dial where a pointer will rotate and intercept the light source and a barrel counter where the light source is directed at the least significant digit.

It will be appreciated that special precautions will be necessary for water meters that may become submerged. Where this condition is anticipated, special sealants and gaskets may be required. However, in the domestic environment, most water meters will be new, can be placed where they do not get easily submerged and the optical head could be designed into them.

On installation, an optical fibre device at the end of a transmission path could be attached to the glass or plastic of the meter with a transparent but slightly sticky glue which hardens by UV light when the correct position for focus and direction on to the relevant dial has been found. The same glue will attach Light Pipes to an optical fibre device.

The light pipes do not need to be of high optical quality nor do they need to convey a coherent image. Thus they can be relatively cheap and clad by a simple but tough plastic cover. Because the prism and lens of the device could be symmetrical, there is no requirement to ensure that the Light Pipe of a pair is handed. (It would appear similar to a length of twin core plastic flex).

BRIEF DESCRIPTION OF THE DRAWINGS

An example of a meter reading arrangement in accordance with the invention will now be described with reference to the four sheets of the accompanying drawing.

In the figures.

DETAILED DESCRIPTION OF THE PREFERRED EMBODIMENTS

Figure 1:
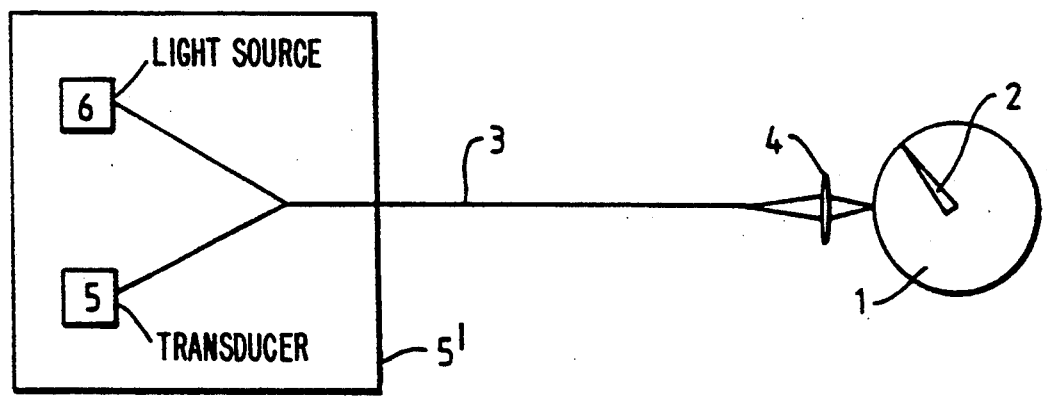
FIG. 1 is schematic diagram of an optical meter reader embodying the basic principles of the arrangement.

Referring now to the drawings and particularly to FIG. 1 thereof, this shows a rotating meter dial 1 having a pointer 2. An optical fibre cable 3 comprising a pair of optical fibre light pipes terminates in an optical fibre device comprising a focusing head 4 adjacent the meter dial 1, and at its other end the optical fibre cable terminates one pipe in an optical transducer such as the photodiode 5 and the other pipe in a light emitting source such as an L.E.D 6, both located in an interface unit 51.

As the dial 1 rotates light from the light source 6 is transmitted through the cable 3 and the focusing head 4 onto the edge of the dial 1 and as the pointer 2 passes the focusing head the light which is being reflected from the optical fibre cable 3 onto the dial is interrupted and for a brief period less light is reflected back from the dial along the optical fibre cable to the transducer 5. This gives a light variation effect. It is not always essential to use focusing in the head although this may be convenient.

Figure 2:
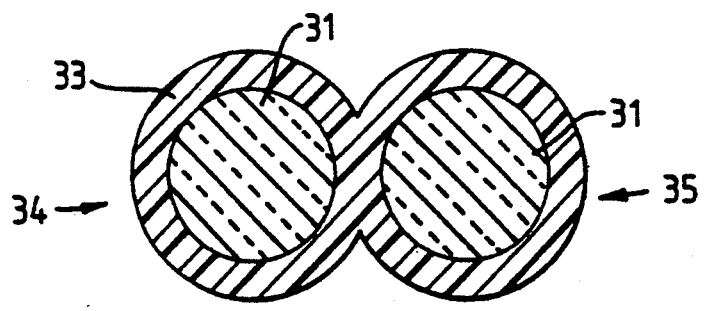
FIG. 2 shows a cross section of the arrangement of a pair of optical fibre transmission paths.

If reference is now made to FIG. 2 this shows the details of the optical fibre transmission paths making up the light pipe 3. In cross section the pipe comprises two cores of optical fibre 31, surrounded by a respective plastics shielding 33. One of the paths 34 is used to transmit light to the meter at the other 35 to transmit reflective light from the meter.

Figure 3:
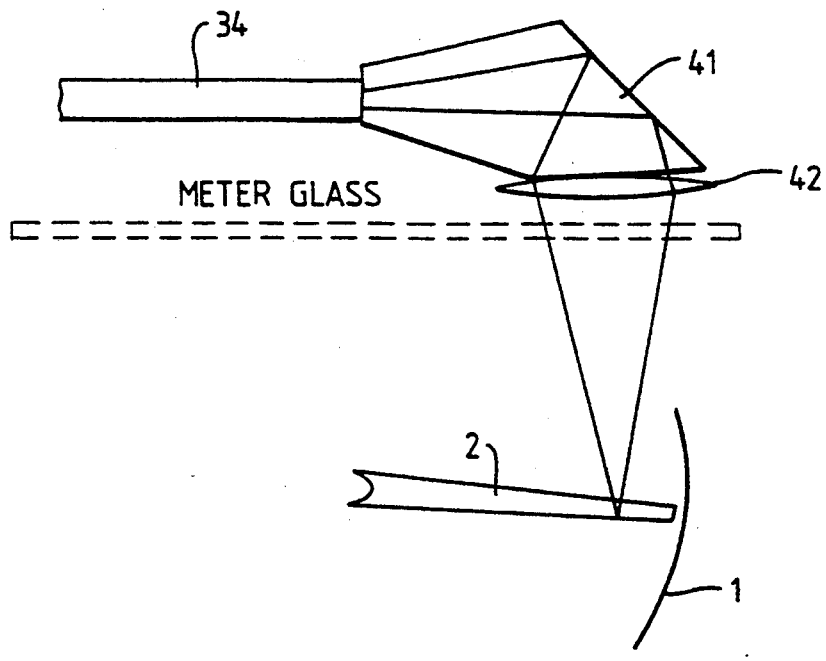
FIG. 3 shows the termination of one of the paths of FIG. 2 to illustrate the focussing of the light transmitted.

Referring also to FIG. 3 here the light path 34 is shown terminating in a prism 41, which with a lens 42 is part of the focusing head 4 of FIG. 1. Light is deflected by prism 41 and focused by lens 42 onto the point 2 of the wheel 1 and reflected light is converted by a similar prism and lens arrangement (not shown). The lens 42 and the prism 41 can be replaced by a (convex) mirror.

Figure 4:
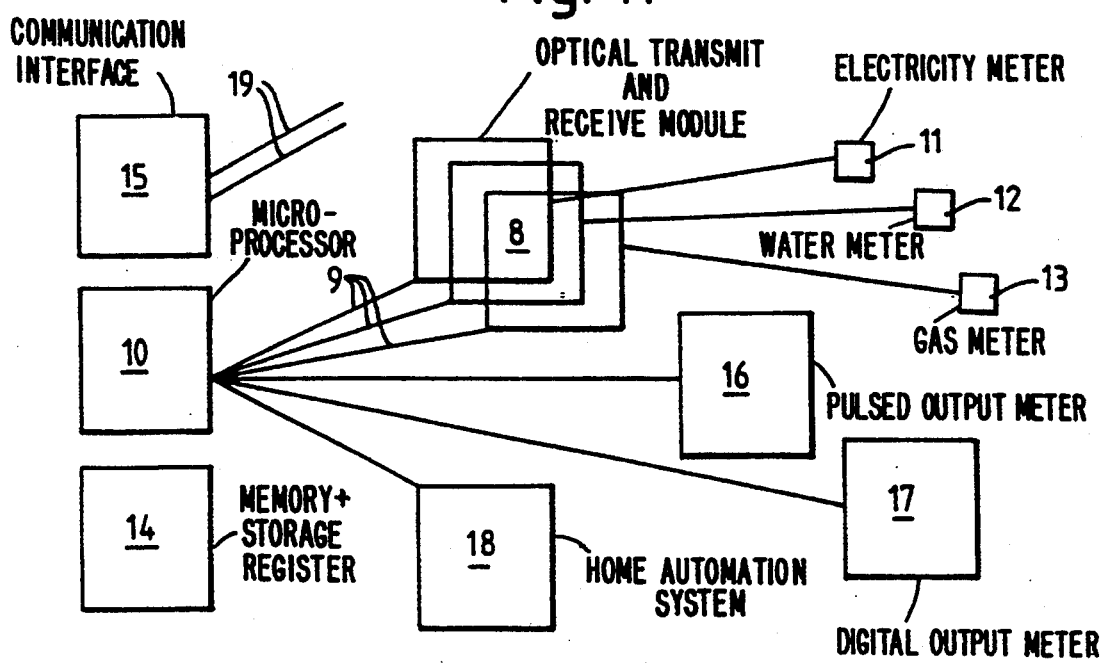
FIG. 4 shows detail of the functional components of the meter interface unit.

Reference is now made to FIG. 4 this shows the set-up of a meter interface unit for monitoring a plurality of meters at a remote location. These meters may well for example be an electricity meter 11, a water meter 12 and a gas meter 13. The essential feature of each meter is that it has a moving marked member which can reflect the light and give a pulsed reflection. Each meter is connected by a respective optical fibre cable 3 to a respective optical transmit and receive module 8 containing the element 6 and 5 as indicated in FIG. 1. Outputs 9 from the modules 8 are connected to a microprocessor 10 which in turn is connected to a memory and storage register 14 and a communications interface 15. Further connections to the microprocessor 10 are a pulsed output meter 16 and a digital output meter 17 as well as possibly a home automation system 18.

Indications of movement from the meters 11, 12 and 13 are transmitted to the respective modules 8 where a signal is generated depending on the number of movements made in the meters over lines 9 to microprocessor 10. This carries out programs on an analogue/digital basis which recognise the patterns produced by the optical transducer in the units 8 and counts the units of consumption and stores them in the registers 14. It will also count and store units of consumption from meters such as 16 which have pulsed output systems and store data from meters such as 17 which have digital outputs. Thus the whole arrangement is not limited to merely one type of meter but can integrate all types of meter.

The microprocessor 10 is able to be programmed to provide active line testing for a telephone network on demand and to be able to communicate with home automation devices 18 such as those attached to an established Creda Net (RTM) or a similar system. The unit should also be able to interface with a number of standard networks to increase its applicability.

In operation light from a light source 6 such as an L.E.D is transmitted over an optical light pipe as shown in FIG. 2, although a single fibre could be used if a beam splitter was fitted at the meter interface unit end. The choice of fibre depends greatly on the type of installation and the length of the transmission path involved. In certain applications single fibres may be preferable. The light transmitted may come from a modulated source since this enhances the sensitivity of the arrangement and provides an indication of any break in the fibre which may have occurred for any reason. If modulated light is included then the optical transducer 5 receiving the reflected light will have to take account and sense this (such an arrangement would use phase lock loop circuitry).

If reference is now made to FIG. 5 the light level outputs which will be received by the optical transducer 5 will be appreciated for the different types of rotating indicator.

Figure 5A:
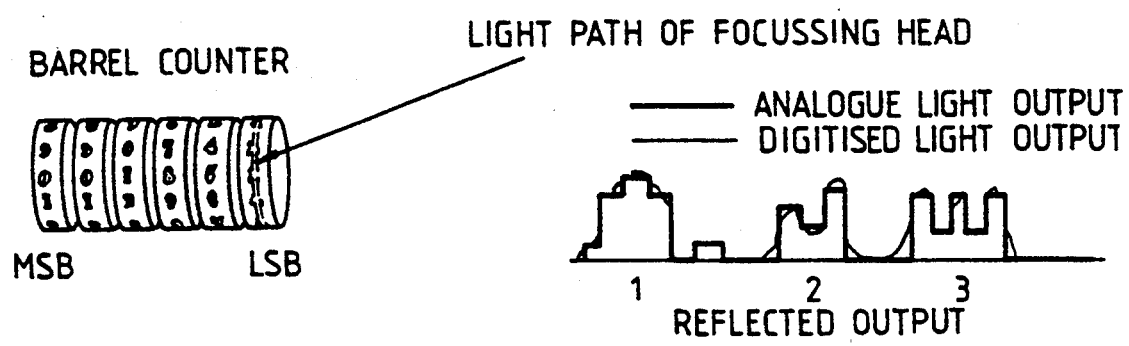
FIGS. 5a and 5b show different types of rotating members which can be used to originate incremental counts.

In FIG. 5a a barrel counter is shown with the barrels having the most significant bit (MSB) on the left and the least significant bit (LSB) on the right. The light from the light source 6 will be focused on the least significant bit barrel and this is engraved and marked with normal arabic numerals. Because of the shape of the numerals a different light level will be produced and reflected back down the cable 3 to the transducer 5 every time that a number passes a focusing head. The output light level for the various numerals is shown to the right of FIG. 5a and this is shown both from the analogue light output and the converted digitised output. It will be seen that each figure has a characteristic light level. This light level is not significant in the present application although with sophisticated circuitry a recognition could be established to determine which number is being observed and reflected. The idea of the invention is to count the revolutions of the least significant digit of the barrel remotely, using optical means.

Figure 5B:
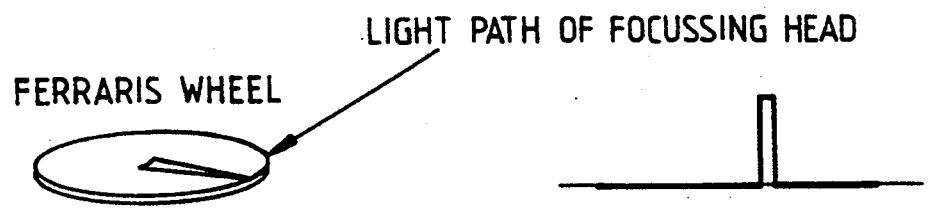

The disc shown in FIG. 5b is the Ferraris wheel of the type used commonly in electricity meters where a pointer overlaps on the edge to give a mark on the edge and observation is made of the edge of the disc as it rotates. In this case the light is focused on the edge of the disc and each time the mark on the Ferraris wheel passes the light path the reflection is interrupted and this gives a single pulse of narrow width as is indicated in FIG. 5b. The output from a dial with a pointer will be similar.

Figure 6:
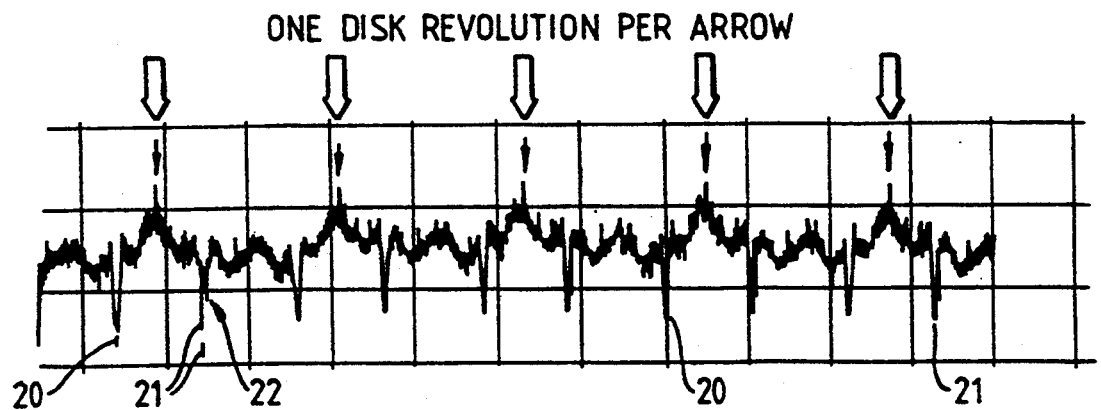
FIG. 6 is a trace of the output from a meter indicating how the transmitted output can be analysed.

FIG. 6 shows a typical trace from an electricity meter where it can be seen that the pattern output is regular and indications are given of light level changes where a long stripe occurs at 20 where a short stripe occurs at 21 and where this is a notch in the disc at 22. The sequence of light levels are able to be counted in the microprocessor 10 and stored in the registers 14 and 17 where they can be later abstracted and used for filing and accounting purposes. There is no need for the registers to be actually inspected but they ,can be interrogated by the telephone interface unit and the information passed over telephone lines 10 to a remote recording unit.

Figure 7:
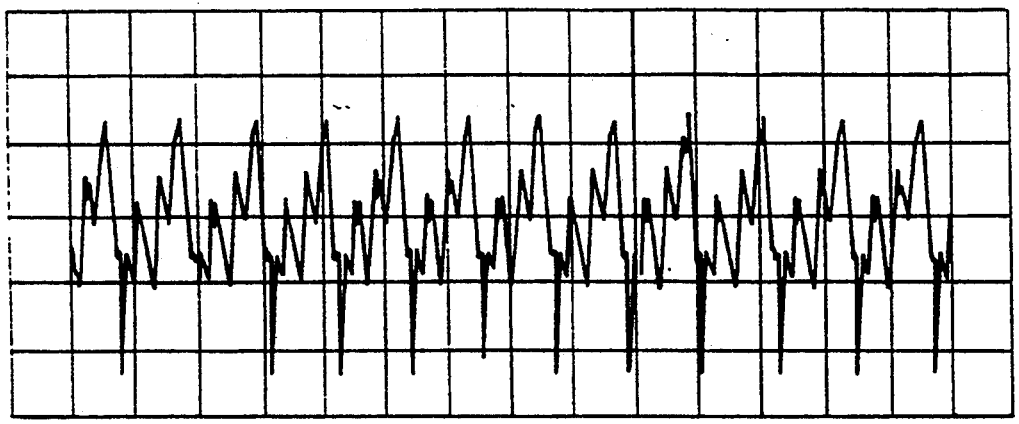
FIGS. 7(a), 7(b) and 7(c) show three waveforms typically obtained from each an electricity, water and gas meter.
Figure 7:
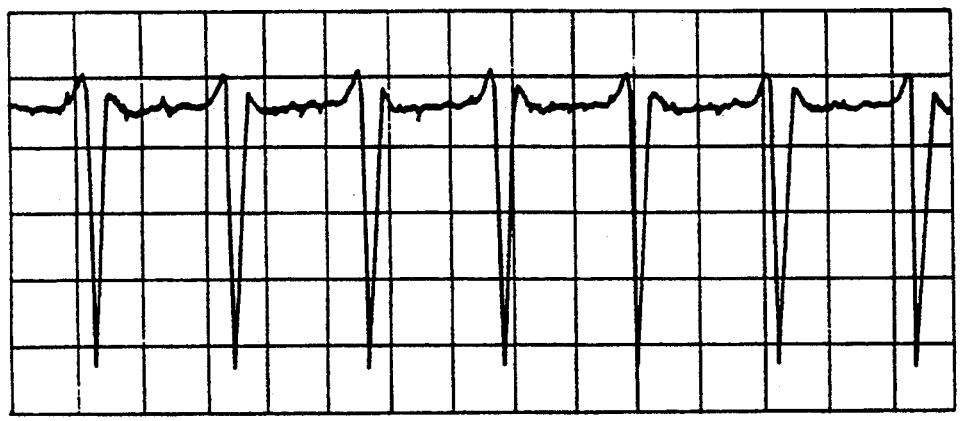
Figure 7:
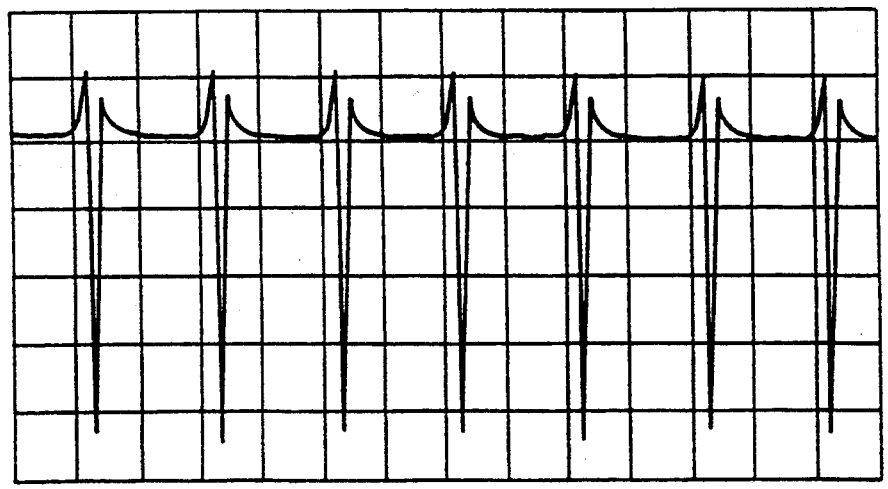

FIGS. 7(a), (b) and (c) show respectively outputs may be obtained from the Electricity, Water and Gas meters 11, 12 and 13. It will be noted that whereas each waveform is substantially different they are cyclic and repeat the same set of sequential output levels. It is this repetition which is important in the digital conversion. The time period taken by each sequence is unimportant.

The arrangement provides a simple and inexpensive way of reading a plurality of meters in a domestic installation and from time to time assessing the information gathered so that utility billing can take place. Most types of meters are able to be interrogated and recorded and since optical fibre cables are used there is no risk of danger from having separate electric light sources in areas such as gas meters where incendive sparking might occur and cause explosions or with water meters where the ingress of water can cause electronics to fail.

The whole installation is cheap and easy to install and can run for many years without any maintenance or servicing as it is basically a passive arrangement.

I claim:

1. A meter reading arrangement mounted eternally to a meter, comprises: means for directing light at a fastest moving indicator on the meter for reflection from the indicator; and an optical fibre transmission path for linking the meter to a remotely located meter interface unit, one end of the transmission path being directed at the fastest moving indicator and the other end onto transducer means at the interface unit, each variation in light level reflected from the indicator being transmitted to the interface unit for processing.

2. An arrangement as claimed in claim 1 and including a second fibre optical transmission path over which light is directed from a remote source onto the indicator for reflection to the interface unit.

3. An arrangement a claimed in claim 1 in which focusing means are provided adjacent the meter for focusing transmitted and/or reflected light.

4. An arrangement as claimed in claim 1, wherein the transducer means is operative for sensing each sequential variation in the amplitude of reflected transmitted light.

5. An arrangement as claimed in claim 1, wherein the meter interface unit connects light from a plurality of meters remotely situated from the interface unit and from each other, each meter being monitored over a separate optical path, and integrates all the information provided by the variations in light levels, for further onward transmission via onward transmission means to another location for interpretation.

6. An arrangement as claimed in claim 5 wherein the onward transmission means includes, coaxial cables, telephone lines, radio or main carrier transmission over power cables.

7. An arrangement as claimed in claim 1 wherein the light is modulated.

8. An arrangement as claimed in claim 7 wherein the modulated light is mono chromatic.

9. An arrangement as claimed in claim 1 wherein the indicator is a rotating member.

10. An arrangement as claimed in claim 9 in which the member is a Ferraris disk having markings on at least one of its edge and face.

11. An arrangement as claimed in claim 9 in which the member is a test dial where a pointer rotates and intercepts the light.

12. An arrangement as claimed in claim 9 in which the member is a barrel counter where the light is directed at the least significant digit.

13. An arrangement as claimed in claim 3, and sealing means for securing the end of the optical fibre transmission path to at least one of the meter and the focusing means.

14. An arrangement as claimed in claim 3 in which the focusing means includes a prism and a lens associated therewith.

15. A meter reading arrangement as claimed in claim 3 in which the focusing means includes mirror means.

* * * * *